(12) United States Patent
Kuo et al.

(10) Patent No.: US 9,450,560 B2
(45) Date of Patent: Sep. 20, 2016

(54) WIRELESS TRANSCEIVER WITH FUNCTION OF ADJUSTMENT FOR FREQUENCY-BAND MATCHING AND THE ADJUSTING METHOD THEREFOR

(71) Applicant: AIROHA TECHNOLOGY CORP., Hsinchu (TW)

(72) Inventors: Bing-Jye Kuo, Hsinchu (TW); Tao-Yi Lee, Hsinchu (TW)

(73) Assignee: Airoha Technology Corp., Hsinchu (TW)

( * ) Notice: Subject to any disclaimer, the term of this patent is extended or adjusted under 35 U.S.C. 154(b) by 161 days.

(21) Appl. No.: 14/283,436

(22) Filed: May 21, 2014

(65) Prior Publication Data
US 2015/0214920 A1 Jul. 30, 2015

(30) Foreign Application Priority Data
Jan. 28, 2014 (TW) .............................. 103103151 A

(51) Int. Cl.
*H01P 5/12* (2006.01)
*H03H 7/46* (2006.01)
*H03H 7/38* (2006.01)

(52) U.S. Cl.
CPC ............... *H03H 7/468* (2013.01); *H03H 7/38* (2013.01)

(58) Field of Classification Search
USPC ................... 333/124–126, 129, 132
See application file for complete search history.

(56) References Cited

U.S. PATENT DOCUMENTS

| 7,379,751 | B2 | 5/2008 | Wada et al. | |
| 2010/0321129 | A1* | 12/2010 | Onody | H01P 1/213 333/124 |
| 2013/0069737 | A1* | 3/2013 | See | H04B 1/18 333/32 |

FOREIGN PATENT DOCUMENTS

| CN | 201479119 U | 5/2010 |
| CN | 103227657 A | 7/2013 |
| WO | 02/084788 A1 | 10/2002 |

* cited by examiner

*Primary Examiner* — Robert Pascal
*Assistant Examiner* — Kimberly Glenn
(74) *Attorney, Agent, or Firm* — Rosenberg, Klein & Lee

(57) ABSTRACT

The present invention is related to a wireless transceiver with function of adjustment for frequency-band matching and the adjusting method therefor, mainly comprising a plurality of transmitting circuits, a plurality of receiving circuits, a frequency-band matching adjustment circuit, and a radio-frequency signal transceiving end. In this connection, the transmitting circuits and/or the receiving circuits are connected to the radio-frequency signal transceiving end via the frequency-band matching adjustment circuit. Impedance in the frequency-band matching adjustment circuit may be adjusted on the basis of the frequency-band of a RF signal, when (before) the RF signal is transmitted or received, such that high impedance or low impedance is presented in the frequency-band matching adjustment circuit with respect to the frequency-band of the received or transmitted RF signal. Thereby, loss of RF signal in reception or transmission is reduced.

14 Claims, 12 Drawing Sheets

WIRELESS TRANSCEIVER WITH FUNCTION OF ADJUSTMENT FOR FREQUENCY-BAND MATCHING AND THE ADJUSTING METHOD THEREFOR

FIELD OF THE INVENTION

The present invention is related to a wireless transceiver with function of adjustment for frequency-band matching and the adjusting method therefor, capable of reducing loss of RF signal in reception or transmission.

BACKGROUND

Referring to FIG. 1, there is shown a block diagram of a conventional wireless transceiver. A wireless transceiver 10 is used for transmitting and receiving wireless signals, and comprises an antenna unit 11, a plurality of radio-frequency switch units 12, a plurality of transmission matching units 13, a plurality of reception matching units 14, a plurality of transmitting circuits 15, and a plurality of receiving circuits 17. In this connection, the antenna unit 11 is connected to the transmitting circuits 15 via a part of radio-frequency switch units 12 and the transmission matching units 13, while connected to the receiving circuits 17 via the other part of radio-frequency switch units 12 and the reception matching units 14.

When the RF signal is transmitted via the wireless transceiver 10, a first radio-frequency switch unit 121 is turned on, such that a first transmitting circuit 151 is connected to the antenna unit 11 via a first transmission matching unit 131 and the first radio-frequency switch unit 121, and the RF signal is then sent to the antenna unit 11. When the first radio-frequency switch unit 121 is turned on, a second radio-frequency switch unit 123, a third radio-frequency switch unit 125, and a fourth radio-frequency switch unit 127 is then turned off. Thereby, a second transmitting circuit 153, a first receiving circuit 171, and a second receiving circuit 173 are isolated, so as to enhance the efficiency of sending the RF signal to the antenna unit 11 from the first transmitting circuit 151.

In sending the RF signal at another frequency-band, the second radio-frequency switch unit 123 is then turned on, while the first radio-frequency switch unit 121, the third radio-frequency switch unit 125, and the fourth radio-frequency switch unit 127 are turned off, such that the RF signal is sent to the antenna unit 11 from the second transmitting circuit 153 via a second transmission matching unit 133 and the second radio-frequency switch unit 123.

In receiving the RF signal, the third radio-frequency switch unit 125 may be then turned on, while the first radio-frequency switch unit 121, the second radio-frequency switch unit 123, and the fourth radio-frequency switch unit 127 are turned off, in such a way that the RF signal received by the antenna unit 11 may be sent to the first receiving circuit 171 via the third radio-frequency switch unit 125 and a first reception matching unit 141. Moreover, the fourth radio-frequency switch unit 127 may be also turned on, while the first radio-frequency switch unit 121, the second radio-frequency switch unit 123, and the third radio-frequency switch unit 125 are turned off, in such a way that the RF signal received by the antenna unit 11 may be sent to the second receiving circuit 173 via the fourth radio-frequency switch unit 127 and a second reception matching unit 143. Thereby, the RF signal at another frequency-band may be received.

Each radio-frequency switch unit 12 of the wireless transceiver 10 may be switched, so as to receive and transmit the RF signal. However, it is necessary for the wireless transceiver 10 to be provided with several radio-frequency switch units 12, several transmission matching units 13, and several reception matching units 14, leading to incapability of reducing the area and manufacturing cost of the wireless transceiver 10 effectively. Moreover, during the process of transmitting or receiving RF signal, the RF signal should pass through one of the radio-frequency switch units 12, resulting in loss of RF signal.

SUMMARY OF THE INVENTION

It is one object of the present invention to provide a wireless transceiver with function of adjustment for frequency-band matching, mainly comprising a plurality of receiving circuits, a plurality of transmitting circuits, a radio-frequency signal transceiving end, a frequency-band matching adjustment circuit, and a plurality of frequency-band matching circuits. In this connection, the frequency-band matching adjustment circuit is connected to the receiving circuits or the transmitting circuits, while the frequency-band matching circuits are connected to the receiving circuits or the transmitting circuits which are not connected to the frequency-band matching adjustment circuit. During the process of transmitting or receiving RF signal, impedance in the frequency-band matching adjustment circuit may be adjusted on the basis of the frequency-band of the RF signal, thereby reducing loss of received or transmitted RF signal.

It is one object of the present invention to provide a wireless transceiver with function of adjustment for frequency-band matching, mainly comprising a plurality of receiving circuits, a plurality of transmitting circuits, a radio-frequency signal transceiving end, a first frequency-band matching adjustment circuit, and a second frequency-band matching adjustment circuit. In this connection, the first frequency-band matching adjustment circuit is connected to the receiving circuits, while the second frequency-band matching adjustment circuit is connected to the transmitting circuits. During the process of transmitting or receiving RF signal, impedance in the first frequency-band matching adjustment circuit and the second frequency-band matching adjustment circuit may be adjusted on the basis of the frequency-band of the RF signal, thereby reducing loss of received or transmitted RF signal.

It is one object of the present invention to provide an adjusting method for frequency-band matching of a wireless transceiver, mainly comprising the adjustment of impedance in the frequency-band matching adjustment circuit, connected to the receiving circuits and/or the transmitting circuits, on the basis of the frequency-band of the received or transmitted RF signal, such that high impedance or low impedance is presented in the frequency-band matching adjustment circuit with respect to the frequency-band of the received or transmitted RF signal. Thereby, loss of received or transmitted RF signal is reduced.

It is one object of the present invention to provide an adjusting method for frequency-band matching of a wireless transceiver, mainly comprising the adjustment of the frequency-band matching adjustment circuit, connected to the receiving circuits and/or the transmitting circuits, on the basis of the frequency-band of the received or transmitted RF signal, such that the frequency-band matching adjustment circuit is operated as a notch filter with function of adjustment, and used for filtering out the signals at specific frequency-band multiplied by one, two, three, or any multiple.

To achieve these and other objects of the present invention, the present invention provides a wireless transceiver with function of adjustment for frequency-band matching, used for receiving and transmitting a RF signal, comprising: a plurality of transmitting circuits; a plurality of receiving circuits; a frequency-band matching adjustment circuit, connected to the plurality of receiving circuits or the plurality of transmitting circuits, and adjusting impedance in the frequency-band matching adjustment circuit on the basis of frequency-band of received or transmitted RF signal; a plurality of frequency-band matching circuits, connected to the plurality of transmitting circuits or the plurality of receiving circuits not connected to the frequency-band matching adjustment circuit, respectively, wherein lower impedance is presented in the plurality of frequency-band matching circuits with respect to RF signals at individual frequency-bands, respectively; and a radio-frequency signal transceiving end, connected to the frequency-band matching adjustment circuit and the frequency-band matching circuit.

Further, the present invention provides another wireless transceiver with function of adjustment for frequency-band matching, used for receiving and transmitting a RF signal, comprising: a plurality of transmitting circuits; a plurality of receiving circuits; a first frequency-band matching adjustment circuit, connected to the plurality of transmitting circuits, and adjusting impedance on the basis of frequency-band of the RF signal; a second frequency-band matching adjustment circuit, connected to the plurality of receiving circuits, and adjusting impedance on the basis of frequency-band of the RF signal; and a radio-frequency signal transceiving end, connected to the first frequency-band matching adjustment circuit and the second frequency-band matching adjustment circuit.

The present invention provides an adjusting method for frequency-band matching of a wireless transceiver, wherein the wireless transceiver comprises a plurality of transmitting circuits, a plurality of frequency-band matching circuits, a plurality of receiving circuits, a frequency-band matching adjustment circuit, and a radio-frequency signal transceiving end, the frequency-band matching adjustment circuit being connected to the transmitting circuits or the receiving circuits, while the frequency-band matching circuits being connected to the transmitting circuits or the receiving circuits not connected to the frequency-band matching adjustment circuit, comprising the steps as follows: adjusting impedance in the frequency-band matching adjustment circuit on the basis of frequency-band of a RF signal to be received or transmitted desirably; and receiving or transmitting the RF signal at the frequency-band.

Further, the present invention provides another adjusting method for frequency-band matching of a wireless transceiver, wherein the wireless transceiver comprises a plurality of transmitting circuits, a plurality of receiving circuits, a first frequency-band matching adjustment circuit, a second frequency-band matching adjustment circuit, and a radio-frequency signal transceiving end, the first frequency-band matching adjustment circuit and the second frequency-band matching adjustment circuit being connected to the transmitting circuits and the receiving circuits, respectively, comprising the steps as follows: adjusting impedance in the first frequency-band matching adjustment circuit and the second frequency-band matching adjustment circuit on the basis of frequency-band of a RF signal to be received or transmitted desirably: and receiving or transmitting the RF signal at the frequency-band.

In one embodiment of the wireless transceiver, the frequency-band matching adjustment circuit comprises a variable capacitor, at least one inductor, and a switch unit, the variable capacitor being connected to the inductor in series, the switch unit being connected at one end thereof to the variable capacitor or the inductor, while the switch unit being connected at the other end thereof to the ground.

In one embodiment of the wireless transceiver, impedance in the frequency-band matching adjustment circuit is adjusted via the variable capacitor and the switch unit.

In one embodiment of the wireless transceiver, the frequency-band matching adjustment circuit comprises at least one capacitor, a variable inductor, and a switch unit, the capacitor being connected to the variable inductor in series, the switch unit being connected at one end thereof to the variable inductor, or the capacitor, while the switch unit being connected at the other end thereof to the ground.

In one embodiment of the wireless transceiver, the first frequency-band matching adjustment circuit comprises a first variable capacitor, at least one first inductor, and a first switch unit, the first variable capacitor being connected to the first inductor in series, the first switch unit being connected at one end thereof to the first variable capacitor or the first inductor, the first switch unit being connected at the other end thereof to the ground, while the second frequency-band matching adjustment circuit comprises a second variable capacitor, at least one second inductor, and a second switch unit, the second variable capacitor being connected to the second inductor in series, the second switch unit being connected at one end thereof to the second variable capacitor or the second inductor, the second switch unit being connected at the other end thereof to the ground.

In one embodiment of the adjusting method, the frequency-band matching adjustment circuit comprises a variable capacitor, at least one inductor, and a switch unit, the variable capacitor being connected to the inductor, the switch unit being connected at one end thereof to the variable capacitor or the inductor, while the switch unit being connected at the other end thereof to the ground.

In one embodiment of the adjusting method, the frequency-band matching adjustment circuit is connected to the receiving circuits, while the frequency-band matching circuits are connected to the transmitting circuits, comprising the steps as follows: turning on the switch unit, such that the variable capacitor and the inductor are connected to the ground via the switch unit; adjusting capacitance of the variable capacitor on the basis of the frequency-band of the RF signal to be transmitted by the transmitting circuits desirably, such that high impedance is presented in the frequency-band matching adjustment circuit with respect to the frequency-band of the RF signal to be transmitted by the transmitting circuits; and sending the RF signal to the radio-frequency signal transceiving end by one of the transmitting circuits via the frequency-band matching circuit connected thereto.

In one embodiment of the adjusting method, comprises the steps as follows: turning off the switch unit, such that the radio-frequency signal transceiving end is connected to the receiving circuits via the variable capacitor and the inductor; adjusting capacitance of the variable capacitor on the basis of the frequency-band of the RF signal to be received by the receiving circuits desirably, such that low impedance is presented in the frequency-band matching adjustment circuit with respect to the frequency-band of the RF signal to be received by the receiving circuits desirably; and receiving the RF signal by the receiving circuits from the radio-frequency signal transceiving end via the frequency-band matching adjustment circuit.

In one embodiment of the adjusting method, the frequency-band matching adjustment circuit is connected to the transmitting circuits, while the frequency-band matching circuits are connected to the receiving circuits, comprising the steps as follows: turning off the switch unit, such that the radio-frequency signal transceiving end is connected to the transmitting circuits via the variable capacitor and the inductor; adjusting capacitance of the variable capacitor on the basis of the frequency-band of the RF signal to be transmitted by the transmitting circuits desirably, such that low impedance is presented in the frequency-band matching adjustment circuit with respect to the frequency-band of the RF signal to be transmitted by the transmitting circuits desirably; and sending the RF signal to the radio-frequency signal transceiving end by one of the transmitting circuits via the frequency-band matching adjustment circuit.

In one embodiment of the adjusting method, comprises the steps as follows: turning on the switch unit, such that the variable capacitor and the inductor are connected to the ground via the switch unit; adjusting capacitance of the variable capacitor on the basis of the frequency-band of the RF signal to be received by the receiving circuits desirably, such that high impedance is presented in the frequency-band matching adjustment circuit with respect to the frequency-band of the RF signal to be received by the receiving circuits desirably; and sending the RF signal to the receiving circuits by the radio-frequency signal transceiving end via one of the frequency-band matching circuits.

In one embodiment of the adjusting method, the first frequency-band matching adjustment circuit comprises a first variable capacitor, at least one first inductor, and a first switch unit, the first variable capacitor being connected to the first inductor, the first switch unit being connected at one end thereof to the first variable capacitor or the first inductor, the first switch unit being connected at the other end thereof to the ground, while the second frequency-band matching adjustment circuit comprises a second variable capacitor, at least one second inductor, and a second switch unit, the second variable capacitor being connected to the second inductor, the second switch unit being connected at one end thereof to the second variable capacitor or the second inductor, the second switch unit being connected at the other end thereof to the ground.

In one embodiment of the adjusting method, comprises the steps as follows: turning off the first switch unit; turning on the second switch unit, such that the radio-frequency signal transceiving end is connected to the ground via the second variable capacitor, the second inductor, and the second switch unit; adjusting capacitance of the first variable capacitor and the second variable capacitor on the basis of the frequency-band of the RF signal to be transmitted by the transmitting circuits desirably, such that low impedance is presented in the first frequency-band matching adjustment circuit with respect to the frequency-band of the RF signal to be transmitted by the transmitting circuits desirably, and that high impedance is presented in the second frequency-band matching adjustment circuit with respect to the frequency-band of the RF signal to be transmitted by the transmitting circuits desirably; and sending the RF signal to the radio-frequency signal transceiving end by one of the transmitting circuits via the first frequency-band matching adjustment circuit connected thereto.

In one embodiment of the adjusting method, comprises the steps as follows: turning on the first switch unit, such that the radio-frequency signal transceiving end is connected to the ground via the first variable capacitor, the first inductor, and the first switch unit; turning off the second switch unit; adjusting capacitance of the first variable capacitor and the second variable capacitor on the basis of the frequency-band of the RF signal to be received by the receiving circuits desirably, such that high impedance is presented in the first frequency-band matching adjustment circuit with respect to the frequency-band of the RF signal to be received by the receiving circuits desirably, and that low impedance is presented in the second frequency-band matching adjustment circuit with respect to the frequency-band of the RF signal to be received by the receiving circuits desirably; and receiving the RF signal by one of the receiving circuits from the radio-frequency signal transceiving end via the second frequency-band matching adjustment circuit.

Although the embodiments of the present invention are illustrated in the figures by way of example, and described in detail in the text, various modifications and alternatives are still allowed. The figures of the present invention may be not drawn to scale. The figures and detailed description therefor may be only specific disclosure, and not used for limiting the present invention. In contrast, modifications, equivalent components, and substitutions on the basis of spirits and scopes of Claims are all covered by the present invention.

DETAILED DESCRIPTION

Figure 1:
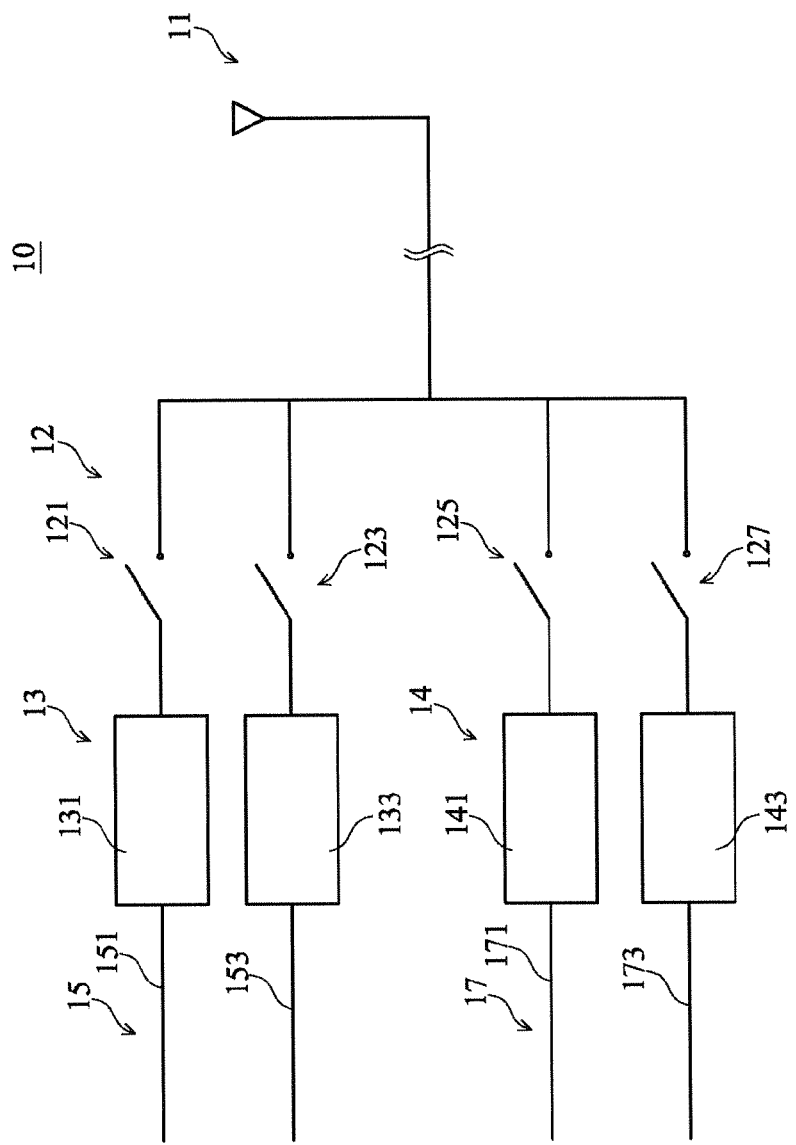
FIG. 1 is a block diagram of a conventional wireless transceiver.
Figure 2:
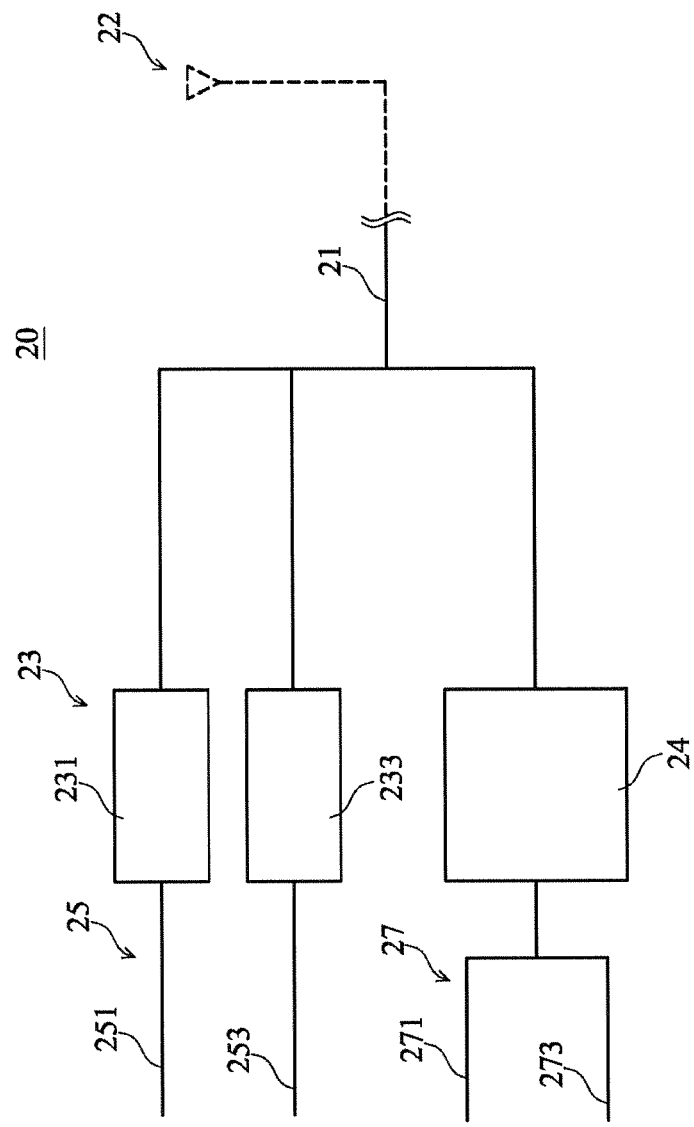
FIG. 2 is a structural diagram of a wireless transceiver with function of adjustment for frequency-band matching according to one embodiment of the present invention.

Referring to FIG. 2, there is shown a structural diagram of a wireless transceiver with function of adjustment for frequency-band matching according to one embodiment of the present invention. As illustrated in the figure, a wireless transceiver 20 described in the embodiment of the present invention comprises a radio-frequency signal transceiving end 21, a plurality of frequency-band matching circuits 23, a frequency-band matching adjustment circuit 24, a plurality of transmitting circuits 25, and a plurality of receiving circuits 27, in which the frequency-band matching adjustment circuit 24 is connected to the plurality of receiving circuits 27 or the plurality of transmitting circuits 25, while the plurality of frequency-band matching circuits 23 are connected to a plurality of transmitting circuits 25 or a plurality of receiving circuits 27 not connected to the frequency-band matching adjustment circuit 24, respectively. In this embodiment, the receiving circuits 27 are connected to the radio-frequency signal transceiving end 21 via the frequency-band matching circuit 24, while each of the transmitting circuits 25 is connected to the radio-frequency signal transceiving end 21 via individual frequency-band matching circuit 23, respectively.

Figure 3:
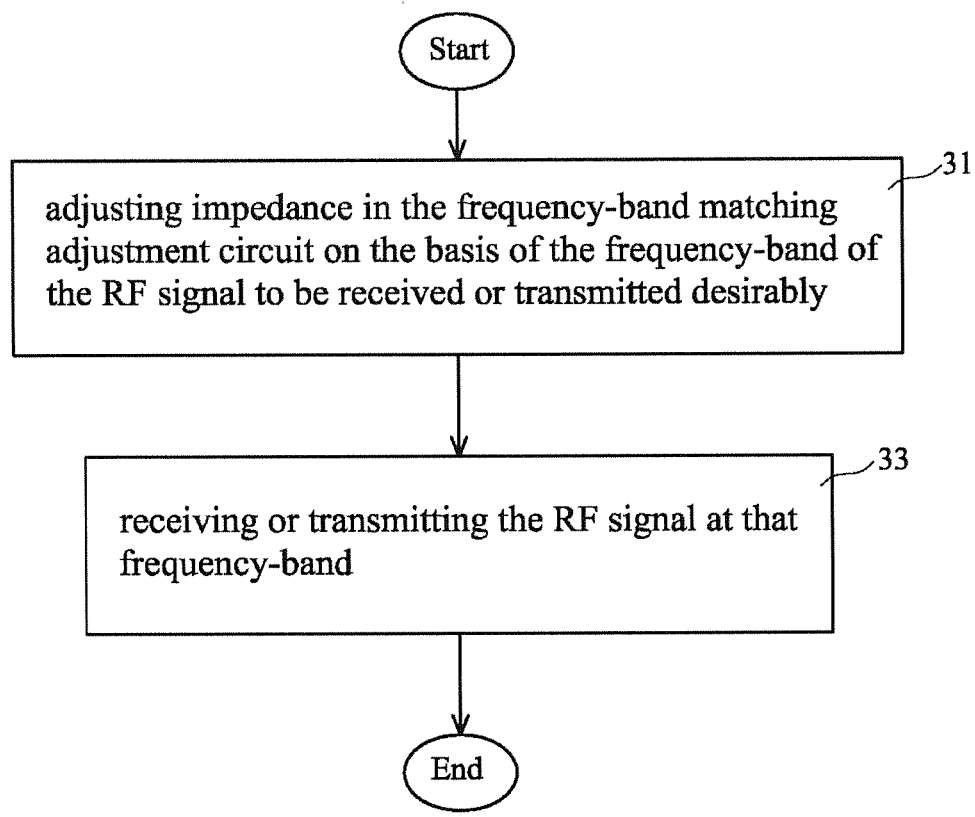
FIG. 3 is a flow chart showing the steps of an adjusting method for frequency-band matching of a wireless transceiver according to one embodiment of the present invention.

Impedance in the frequency-band matching adjustment circuit 24 is adjustable. Referring to FIG. 3 cooperatively, in one embodiment of the present invention, impedance in the frequency-band matching adjustment circuit 24, connected to the receiving circuits 27 or the transmitting circuits 25, may be adjusted on the basis of the frequency-band of RF signal to be received or transmitted desirably, as illustrated in step 31. After impedance in the frequency-band matching adjustment circuit 24 is adjusted, the RF signal at that frequency-band may be then received or transmitted, as illustrated in step 33.

Figure 4:
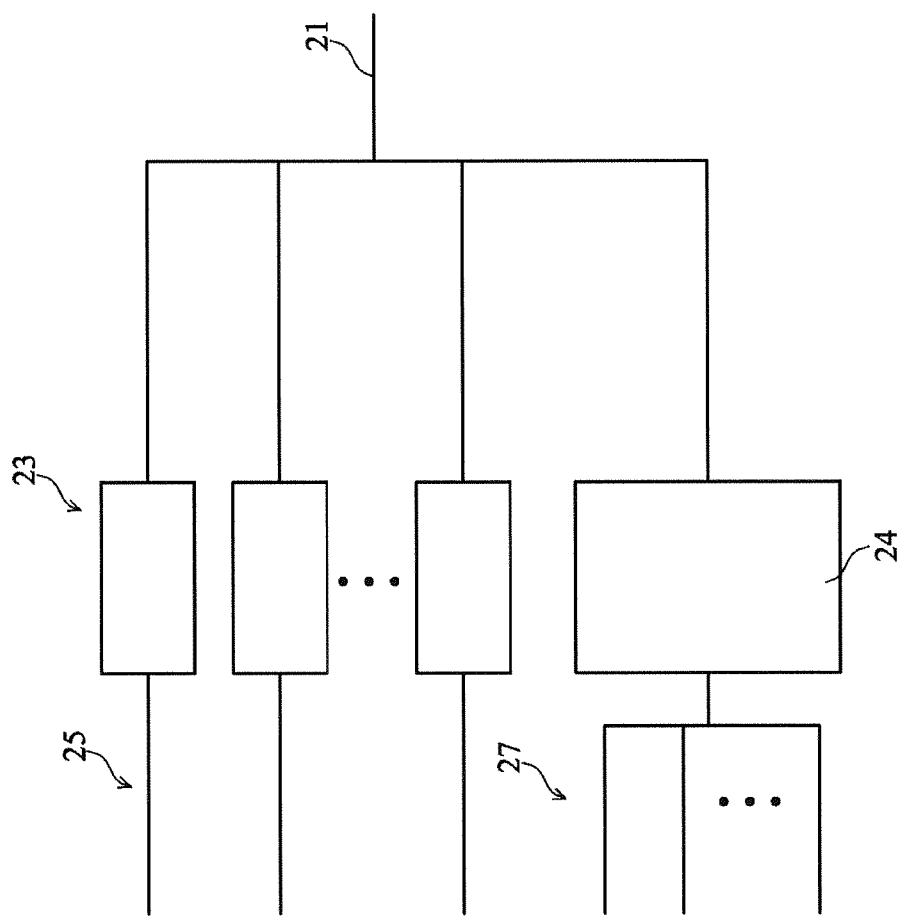
FIG. 4 is a structural diagram of the wireless transceiver with function of adjustment for frequency-band matching according to a further embodiment of the present invention.

For the convenience for description, the number of frequency-band matching circuits 23, that of transmitting circuits 25, and that of receiving circuits 27 in this embodiment are all two, taken as an example. Moreover, the radio-frequency signal transceiving end 21 may be also connected to an antenna unit 22, and used for transmitting or receiving RF signal via the antenna unit 22, as shown in FIG. 2. In another embodiment, naturally, the number of frequency-band matching circuits 23, of transmitting circuits 25, and of receiving circuits 27 may be more than two, as shown in FIG. 4.

In the embodiment of the present invention, the frequency-band matching circuits 23 comprise a first frequency-band matching circuit 231 and a second frequency-band matching circuit 233; the transmitting circuits 25 comprise a first transmitting circuit 251 and a second transmitting circuit 253; as well as the receiving circuits 27 comprise a first receiving circuit 271 and a second receiving circuit 273. The first transmitting circuit 251 is connected to the radio-frequency signal transceiving end 21 via the first frequency-band matching circuit 231, and the second transmitting circuit 253 is connected to the radio-frequency signal transceiving end 21 via the second frequency-band matching circuit 233. Further, the first receiving circuit 271 and the second receiving circuit 273 are both connected to the radio-frequency signal transceiving end 21 via the frequency-band matching adjustment circuit 24.

Individual impedance may be presented in the first frequency-band matching circuit 231 and the second frequency-band matching circuit 233, or lower impedance is presented in the first frequency-band matching circuit 231 or the second frequency-band matching circuit 233, with respect to RF signals at different frequency-bands. In one embodiment of the present invention, low impedance is presented in the first frequency-band matching circuit 231 with respect to the RF signal at the first frequency-band, while high impedance is presented in the second frequency-band matching circuit 233 with respect to the RF signal at the first frequency-band. On the contrary, low impedance is presented in the second frequency-band matching circuit 233 with respect to the RF signal at the second frequency-band, while high impedance is presented in the first frequency-band matching circuit 231 with respect to the RF signal at the second frequency-band. There exists multiple relation between the first frequency-band and the second frequency-band. For instance, the first frequency-band is 900 MHz of RF signal, while the second frequency-band may be 1800 MHz of RF signal.

In one embodiment of the present invention, the first transmitting circuit 251 is used for transmitting the RF signal at the first frequency-band. Signal loss, generated during the process of sending the RF signal to the radio-frequency signal transceiving end 21 via the first transmitting circuit 251 may be reduced, due to low impedance presented in the first frequency-band matching circuit 231 with respect to the RF signal at the first frequency-band and no switch unit provided between the first transmitting circuit 251 and the radio-frequency signal transceiving end 21. Moreover, high impedance is oppositely presented in the second frequency-band matching circuit 233 with respect to the RF signal at the first frequency-band generated by the first transmitting circuit 251. Thus, it is also possible to avoid sending the RF signal at the first frequency-band to the second transmitting circuit 253 via the second frequency-band matching circuit 233, similarly facilitating the reduction of loss of RF signal at the first frequency-band.

In one embodiment of the present invention, the second transmitting circuit 253 is used for transmitting the RF signal at the second frequency-band. Signal loss, generated during the process of sending the RF signal to the radio-frequency signal transceiving end 21 via the second transmitting circuit 253 may be reduced, due to low impedance presented in the second frequency-band matching circuit 233 with respect to the RF signal at the second frequency-band and no switch unit provided between the second transmitting circuit 253 and the radio-frequency signal transceiving end 21. Moreover, high impedance is oppositely presented in the first frequency-band matching circuit 231 with respect to the RF signal at the second frequency-band generated by the second transmitting circuit 253. Thus, it is also possible to avoid sending the RF signal at the second frequency-band to the first transmitting circuit 251 via the first frequency-band matching circuit 231, similarly facilitating the reduction of loss of RF signal at the second frequency-band.

Figure 5:
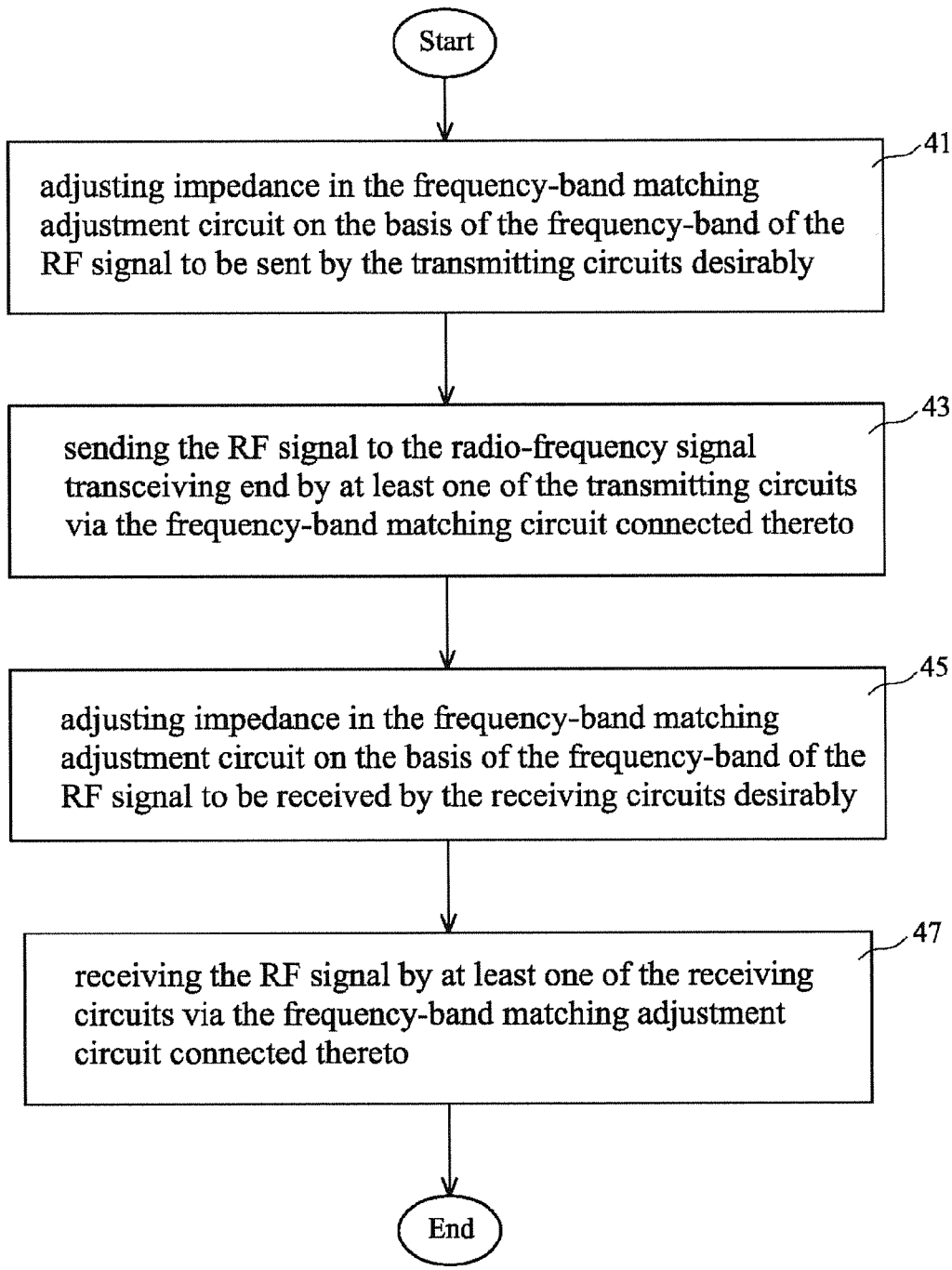
FIG. 5 is a flow chart showing the steps of the adjusting method for frequency-band matching of the wireless transceiver according to a further embodiment of the present invention.

Referring to FIG. 5 cooperatively, in one more detailed embodiments of receiving and transmitting RF signals of the present invention, impedance in the frequency-band matching adjustment circuit 24, connected to the receiving circuits 27, may be adjusted on the basis of the frequency-band of the RF signal to be sent by the transmitting circuits 25 desirably, such that high impedance is presented in the frequency-band matching adjustment circuit 24 with respect to the frequency-band of the RF signal to be sent by the transmitting circuits 25 desirably, as illustrated in step 41.

At least one of the transmitting circuits 25 is allowed for transmitting the RF signal at the specific frequency-band to the radio-frequency signal transceiving end 21 via the frequency-band matching circuit 23 connected thereto, as illustrated in step 43. The RF signal transmitted by the transmitting circuits 25 is not allowed to be sent to the receiving circuits 27 via the frequency-band matching adjustment circuit 24, and signal loss generated during the process of sending the RF signal to the radio-frequency signal transceiving end 21 by the transmitting circuits 25 may be reduced, due to high impedance presented in the frequency-band matching adjustment circuit 24 with respect to the frequency-band of the RF signal transmitted by the transmitting circuits 25

In one embodiment of the present invention, if the RF signal at the first frequency-band is transmitted by the first transmitting circuit 251 desirably, impedance in the frequency-band matching adjustment circuit 24 is adjusted, such that high impedance is presented in the frequency-band matching adjustment circuit 24 with respect to the RF signal at the first frequency-band, so as to avoid sending the RF signal at the first frequency-band to the receiving circuits 27 via the frequency-band matching adjustment circuit 24. On the contrary, if the RF signal at the second frequency-band is transmitted by the second transmitting circuit 253 desirably, impedance in the frequency-band matching adjustment circuit 24 is adjusted, such that high impedance is presented in the frequency-band matching adjustment circuit 24 with respect to the RF signal at the second frequency-band, so as to avoid sending the RF signal at the second frequency-band to the receiving circuits 27 via the frequency-band matching adjustment circuit 24.

Moreover, impedance in the frequency-band matching adjustment circuit 24 connected to the receiving circuits 27 is also adjusted on the basis of the frequency-band of the RF signal to be sent to the receiving circuits 27 by the radio-frequency signal transceiving end 21 desirably, such that low impedance is presented in the frequency-band matching adjustment circuit 24 with respect to the frequency-band of the RF signal to be received by the receiving circuits 27 desirably. For instance, impedance in the frequency-band matching adjustment circuit 24 is adjusted, such that low impedance is presented in the frequency-band matching adjustment circuit 24 with respect to the RF signal at the first frequency-band or second frequency-band, as illustrated in step 45.

At least one of the receiving circuits 27 is allowed for receiving the RF signal at the specific frequency-band from the radio-frequency signal transceiving end 21 via the frequency-band matching adjustment circuit 24 connected thereto, as illustrated in step 47. Signal loss generated during the process of sending the RF signal to the receiving circuits 27 by the radio-frequency signal transceiving end 21 via the frequency-band matching adjustment circuit 24 may be reduced, due to low impedance presented in the frequency-band matching adjustment circuit 24 with respect to the frequency-band of the RF signal received by the receiving circuits 27.

Figure 6:
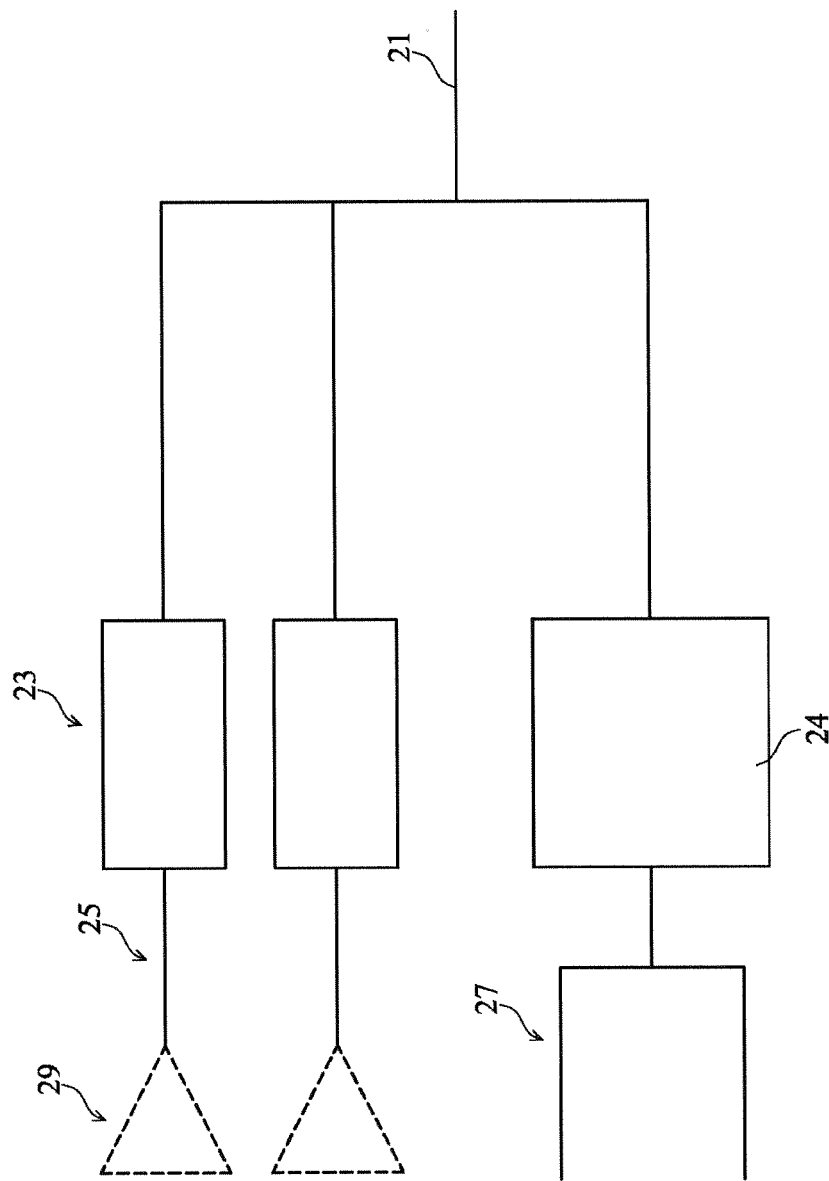
FIG. 6 is a structural diagram of the wireless transceiver with function of adjustment for frequency-band matching according to a further embodiment of the present invention.

In one embodiment of the present invention, each transmitting circuit 25 may be also connected to an amplifier 29, respectively, as illustrated in FIG. 6. The amplifier 29 connected to the transmitting circuits 25 may be turned off during the process of receiving the RF signal from the radio-frequency signal transceiving end 21 by the receiving circuits 27, so as to avoid sending the received RF signal to the transmitting circuits 25, similarly avoiding signal loss probably generated during the process of receiving the RF signal.

Figure 7:
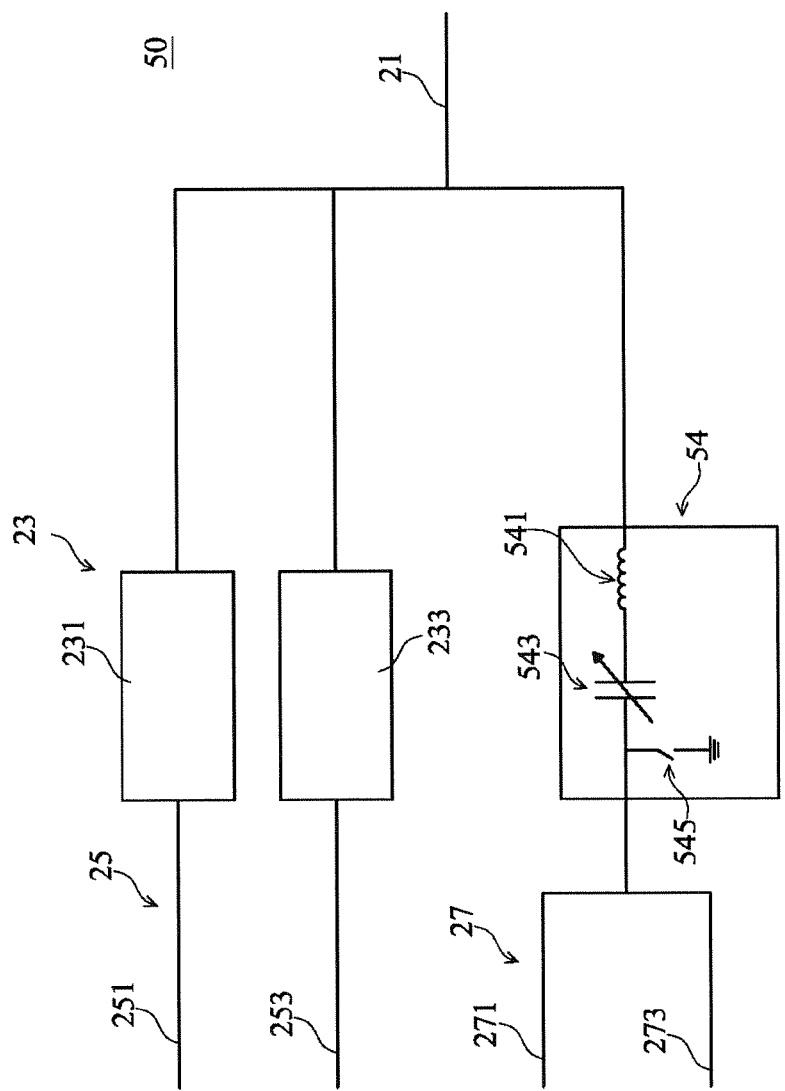
FIG. 7 is a structural diagram of the wireless transceiver with function of adjustment for frequency-band matching according to a further embodiment of the present invention.

Referring to FIG. 7, there is shown a structural diagram of a wireless transceiver with function of adjustment for frequency-band matching according to a further embodiment of the present invention. As illustrated in the figure, a wireless transceiver 50 described in this embodiment of the present invention comprises a radio-frequency signal transceiving end 21, a plurality of frequency-band matching circuits 23, a frequency-band matching adjustment circuit 54, a plurality of transmitting circuits 25, and a plurality of receiving circuits 27, in which each of the transmitting circuits 25 is connected to the radio-frequency signal transceiving end 1 via individual frequency-band matching circuit 23, respectively, while the receiving circuits 27 are connected to the radio-frequency signal transceiving end 21 via the frequency-band matching adjustment circuit 54.

Figure 8:
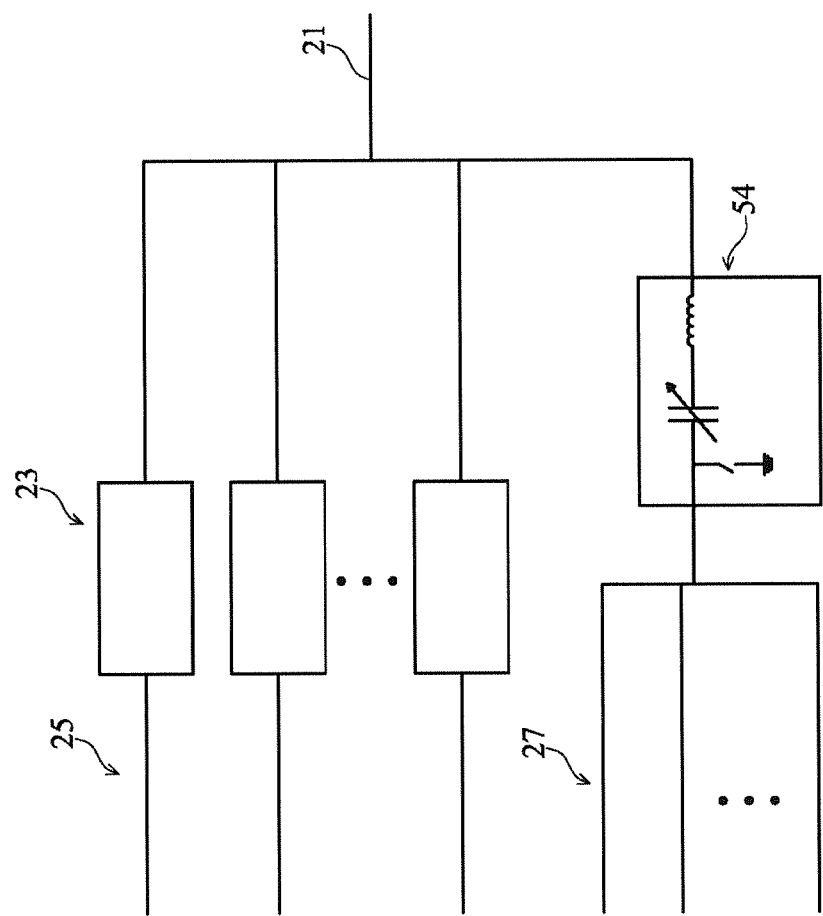
FIG. 8 is a structural diagram of the wireless transceiver with function of adjustment for frequency-band matching according to a further embodiment of the present invention.

For the convenience for description, the number of frequency-band matching circuits 23, that of transmitting circuits 25, and that of receiving circuits 27 are all two, taken as an example, in the embodiment of the present invention, as illustrated in FIG. 7. In another embodiment, naturally, the number of frequency-band matching circuits 23, that of transmitting circuits 25, and that of receiving circuits 27 may be more than two, as illustrated in FIG. 8.

In the embodiment of the present invention, the frequency-band matching circuits 23 comprise a first frequency-band matching circuit 231 and a second frequency-band matching circuit 233. The transmitting circuits 25 comprise a first transmitting circuit 251 and a second transmitting circuit 253. The receiving circuits 27 comprise a first receiving circuit 271 and a second receiving circuit 273. The first transmitting circuit 251 is connected to the radio-frequency signal transceiving end 21 via the first frequency-band matching circuit 231, while the second transmitting circuit 253 is connected to the radio-frequency signal transceiving end 21 via the second frequency-band matching circuit 233. Further, the first receiving circuit 271 and the second receiving circuit 273 are connected to the radio-frequency signal transceiving end 21 via the frequency-band matching adjustment circuit 54.

Impedance in the frequency-band matching adjustment circuit 54 is adjustable. In the embodiment of the present invention, the frequency-band matching adjustment circuit 54 comprises at least one inductor 541, a variable capacitor 543, and a switch unit 545, in which the inductor 541 is connected to the variable capacitor 543 in series, as well as the switch unit 545 is connected at one end thereof to the inductor 541 and/or the variable capacitor 543, while the switch unit 545 is connected at the other end thereof to the ground. In the practical application, impedance in the frequency-band matching adjustment circuit 54 may be changed by the adjustment of capacitance of the variable capacitor 543 together with switching the switch unit 545 for controlling the inductor 541 and/or the variable capacitor 543 to either connect to the ground or not, in such a way that individual impedance may be presented in the frequency-band matching adjustment circuit 54 with respect to RF signal at individual frequency-band.

The switch unit 12 in the prior art is required for featuring isolation to the RF signal of high voltage, such that bulk and manufacturing cost of the switch unit 12 may be hardly reduced effectively. In contrast, the switch unit 545 in the frequency-band matching adjustment circuit 54 described in the present invention is used for switching the variable capacitor 543 and the inductor 541 to either connect to the ground or not, without the loading of RF signal of high voltage at either side of the switch unit 545. Thus, both structure and manufacturing manner of the switch unit 545 used in the present invention are simpler, further facilitating the reduction in manufacturing cost.

Figure 9:
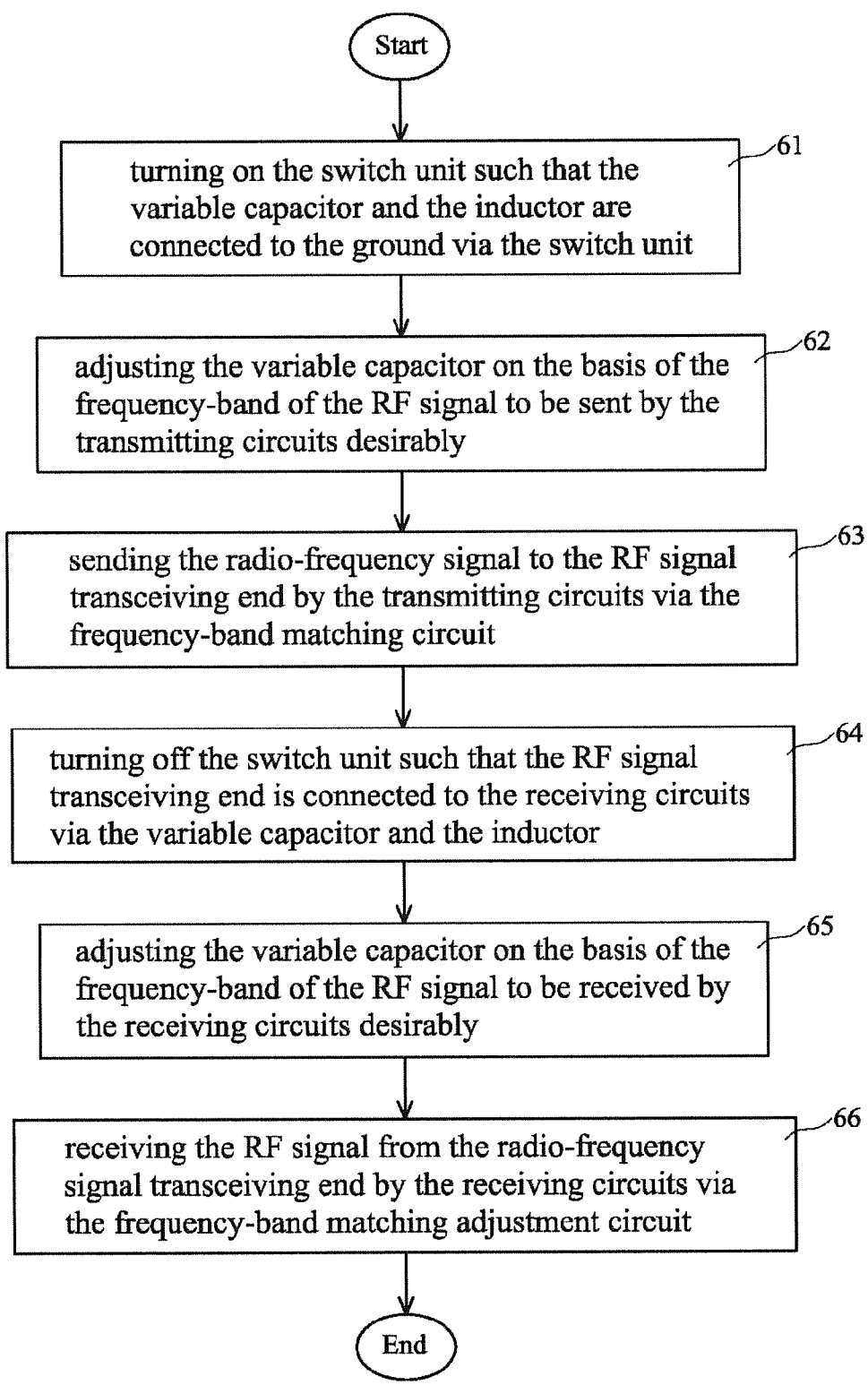
FIG. 9 is a flow chart showing the steps of the adjusting method for frequency-band matching of the wireless transceiver according to a further embodiment of the present invention.

In reception and transmission of RF signal in one embodiment of the present invention, referring to FIG. 9 cooperatively, the switch unit 545 within the frequency-band matching adjustment circuit 54 is turned on, such that the inductor 541 and the variable capacitor 543 are connected to the ground via the switch unit 545, before the RF signal is transmitted by the wireless transceiver 50 via the transmitting circuits 25 desirably, as illustrated in step 61. The capacitance of the variable capacitor 543 in the frequency-band matching adjustment circuit 54 may be adjusted on the basis of the frequency-band of the RF signal to be sent by the transmitting circuits 25 desirably, such that high impedance is presented in the frequency-band matching adjustment circuit 54 with respect to the frequency-band of the RF signal to be sent by the transmitting circuits 25 desirably, so as to avoid sending the RF signal, to be sent by the transmitting circuits 25, to the receiving circuits 27 via the frequency-band matching adjustment circuit 54, as well as reduce loss of RF signal, as illustrated in step 62. Subsequently, at least one of the transmitting circuits 25 is allowed for sending the RF signal to the radio-frequency signal transceiving end 21 via the frequency-band matching circuit 23 connected thereto, so as to perform the operation of transmission of RF signal, as illustrated in step 63.

The switch unit 545 within the frequency-band matching adjustment circuit 54 may be turned off, such that the inductor 541 and the variable capacitor 543 are not connected to the ground, while the radio-frequency signal transceiving end 21 is connected to the receiving circuits 27 via the inductor 541 and the variable capacitor 543, before the RF signal is received by the wireless transceiver 50 from the radio-frequency signal transceiving end 21 via the receiving circuits 27 desirably, as illustrated in step 64. The capacitance of the variable capacitor 543 in the frequency-band matching adjustment circuit 54 may be adjusted on the basis of the frequency-band of the RF signal to be sent to the receiving circuits 27 from the radio-frequency signal transceiving end 21 desirably, such that low impedance is presented in the frequency-band matching adjustment circuit 54 with respect to the frequency-band of the RF signal to be received by the receiving circuits 27 desirably, so as to avoid signal loss generated during the process of sending the RF signal to the receiving circuits 27 from the radio-frequency signal transceiving end 21 via the frequency-band matching adjustment circuit 54, illustrated in step 65. Subsequently, at least one of the receiving circuits 27 is allowed for receiving the RF signal from the radio-frequency signal transceiving end 21 via the frequency-band matching adjustment circuit 54 connected thereto, so as to perform the operation of reception of RF signal, as illustrated in step 66.

Figure 10:
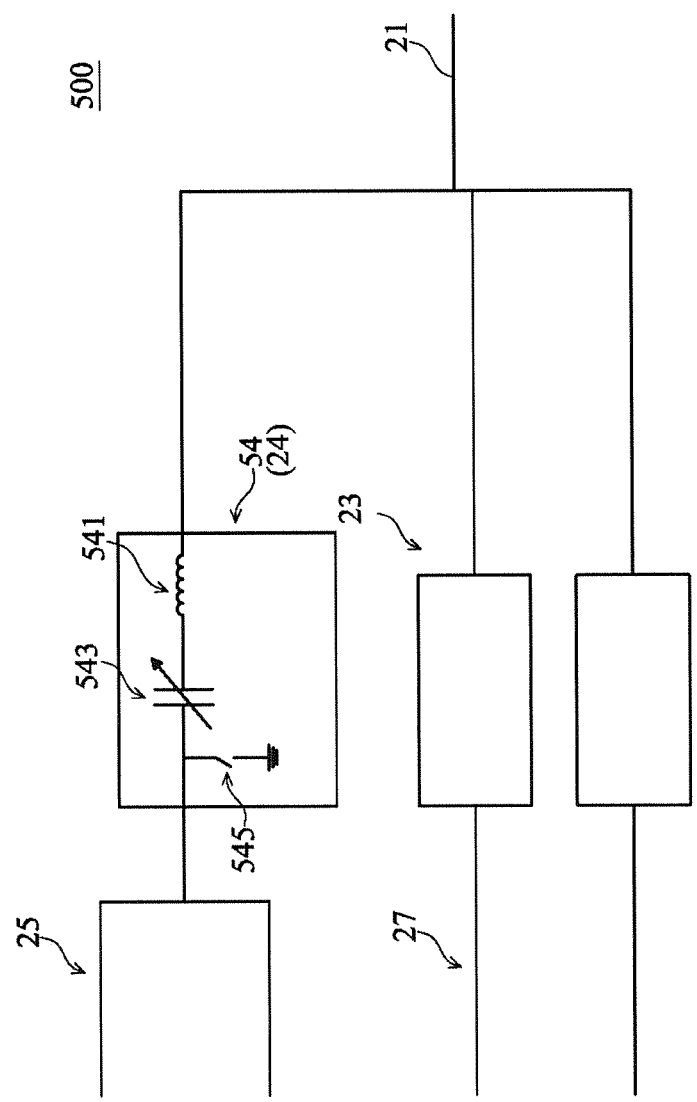
FIG. 10 is a structural diagram of the wireless transceiver with function of adjustment for frequency-band matching according to a further embodiment of the present invention.

In the above embodiments, connecting the receiving circuits 27 to the radio-frequency signal transceiving end 21 via the frequency-band matching adjustment circuit 24/54 is mainly taken as an exemplary embodiment. In another embodiment, referring to FIG. 10 cooperatively, the frequency-band matching adjustment circuit 24/54 of a wireless transceiver 500 is provided between the transmitting circuits 25 and the radio-frequency signal transceiving end 21, while each of the receiving circuits 27 is connected to the radio-frequency signal transceiving end 21 via individual frequency-band matching circuit 23, respectively. During the process of transmission or reception of RF signal, impedance in the frequency-band matching adjustment circuit 24/54 may be adjusted by means of switching the switch unit 545 and adjusting the capacitance of the variable capacitor 543, for example, so as to avoid signal loss generated during the process of reception or transmission of RF signal.

The switch unit 545 within the frequency-band matching adjustment circuit 54 may be turned off, such that the radio-frequency signal transceiving end 21 is connected to the transmitting circuits 25 via the inductor 541 and the variable capacitor 543, before the RF signal is transmitted by the wireless transceiver 500 via the transmitting circuits 25 desirably. The capacitance of the variable capacitor 543 in the frequency-band matching adjustment circuit 54 may be adjusted on the basis of the frequency-band of the RF signal to be sent by the transmitting circuits 25 desirably, such that low impedance is presented in the frequency-band matching adjustment circuit 54 with respect to the frequency-band of the RF signal to be sent by the transmitting circuits 25 desirably. Subsequently, one of the transmitting circuits 25 is allowed for sending the RF signal at that frequency-band to the radio-frequency signal transceiving end 21 via the frequency-band matching adjustment circuit 54, so as to reduce loss generated during the process of sending the RF signal to the radio-frequency signal transceiving end 21 from the transmitting circuits 25 via the frequency-band matching adjustment circuit 54.

The switch unit 545 within the frequency-band matching adjustment circuit 54 is turned on, such that the inductor 541 and the variable capacitor 543 are connected to the ground via the switch unit 545, before the RF signal is received by the receiving circuits 27 from the radio-frequency signal transceiving end 21 desirably. The capacitance of the variable capacitor 543 in the frequency-band matching adjustment circuit 54 may be adjusted on the basis of the frequency-band of the RF signal to be received by the receiving circuits 27 desirably, such that high impedance is presented in the frequency-band matching adjustment circuit 54 with respect to the frequency-band of the RF signal to be received by the receiving circuits 27. Subsequently, the RF signal is sent to the receiving circuits 27 from the radio-frequency signal transceiving end 21 via at least one of the frequency-band matching circuits 23. Thereby, loss of RF signal, resulted from sending the received RF signal to the transmitting circuits 25 via the frequency-band matching adjustment circuit 54, may be reduced.

Figure 11:
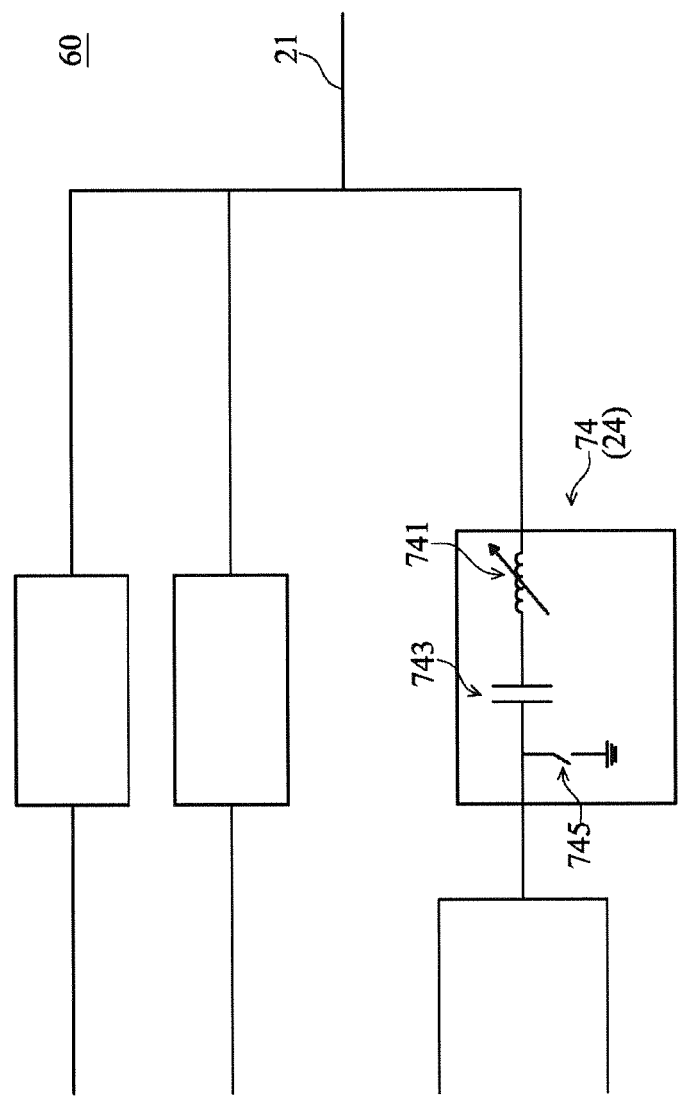
FIG. 11 is a structural diagram of the wireless transceiver with function of adjustment for frequency-band matching according to a further embodiment of the present invention.

In the above embodiments, the frequency-band matching adjustment circuit 54 comprises at least one inductor 541 and one variable capacitor 543 connected in series, as well as impedance in the frequency-band matching adjustment circuit 54 may be adjusted through the adjustment of capacitance of the variable capacitor 543. In another embodiment, however, referring to FIG. 11 cooperatively, a frequency-band matching adjustment circuit 74 may also comprise a variable inductor 741, at least one capacitor 743, and a switch unit 745, as well as impedance in the frequency-band matching adjustment circuit 74 may be adjusted through the adjustment of inductance of the variable inductor 741. Further, the operation of the switch unit 745 is similar to that of the switch unit 545 illustrated in FIG. 7, and should not be described again herein.

Figure 12:
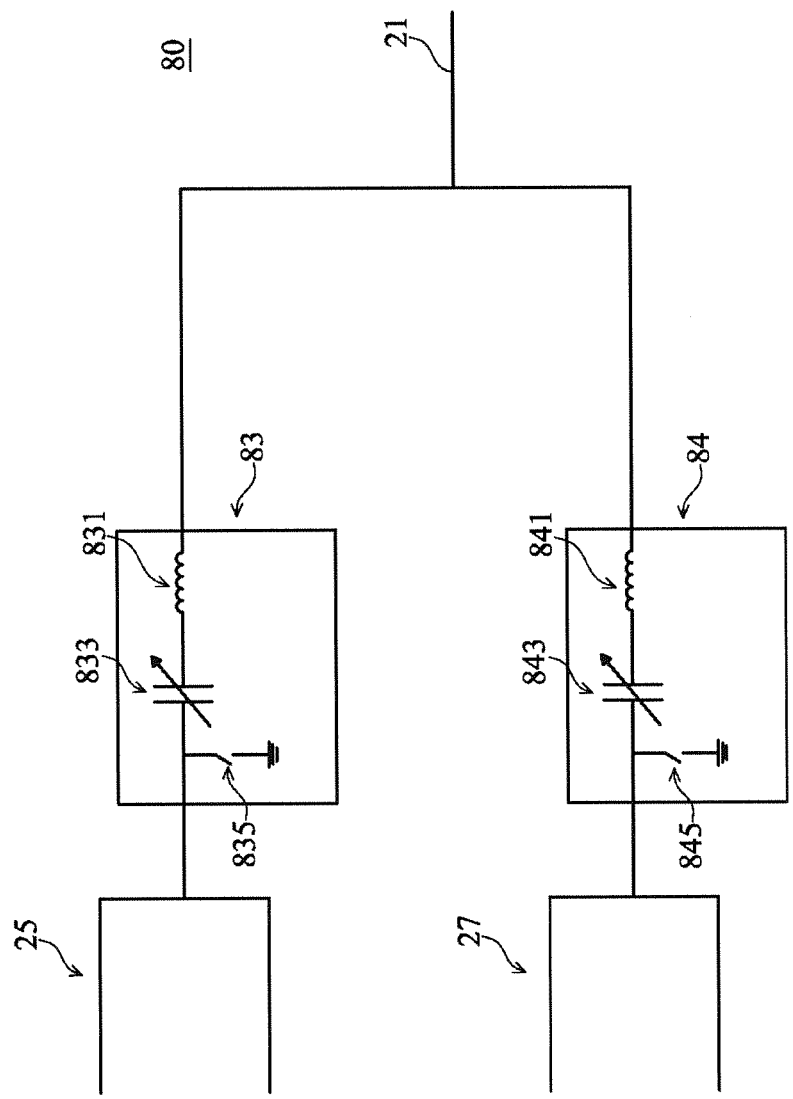
FIG. 12 is a structural diagram of the wireless transceiver with function of adjustment for frequency-band matching according to a further embodiment of the present invention.

Referring to FIG. 12, there is shown a structural diagram of a wireless transceiver with function of adjustment for frequency-band matching according to a further embodiment of the present invention. As illustrated in the figure, a wireless transceiver 80 described in the embodiment of the present invention comprises the radio-frequency signal transceiving end 21, a first frequency-band matching adjustment circuit 83, a second frequency-band matching adjustment circuit 84, the plurality of transmitting circuits 25, and the plurality of receiving circuits 27. In this connection, the transmitting circuits 25 are connected to the radio-frequency signal transceiving end 21 via the first frequency-band matching adjustment circuit 83, while the receiving circuits 27 are connected to the radio-frequency signal transceiving end 21 via the second frequency-band matching adjustment circuit 84. Furthermore, impedance in the first frequency-band matching adjustment circuit 83 and the second frequency-band matching adjustment circuit 84 may be adjusted on the basis of the frequency-band of the RF signal to be transmitted or received desirably, followed by transmitting or receiving the RF signal at that frequency-band.

The first frequency-band matching adjustment circuit 83 comprises at least one first inductor 831, a first variable capacitor 833, and a first switch unit 835, in which the first variable capacitor 833 is connected to the first inductor 831 in series, and the first switch unit 835 is connected at one end thereof to the first variable capacitor 833 and/or the first inductor 831, while the first switch unit 835 is connected at the other end thereof to the ground. The second frequency-band matching adjustment circuit 84 comprises at least one second inductor 841, a second variable capacitor 843, and a second switch unit 845, in which the second variable capacitor 843 is connected to the second inductor 841 in series, and the second switch unit 845 is connected at one end thereof to the second variable capacitor 843 and/or the second inductor 841, while the second switch unit 845 is connected at the other end thereof to the ground.

Before the RF signal is transmitted by the wireless transceiver 80, the first switch unit 835 is turned off, such that the transmitting circuits 25 are connected to the radio-frequency signal transceiving end 21 via the first inductor 831 and the first variable capacitor 833. Moreover, the second switch unit 845 is turned on, such that the radio-frequency signal transceiving end 21 is connected to the ground via the second inductor 841, the second variable capacitor 843, and the second switch unit 845.

The capacitance of the first variable capacitor 833 may be adjusted on the basis of the frequency-band of the RF signal to be transmitted by the transmitting circuits 25 desirably, such that low impedance is presented in the first frequency-band matching adjustment circuit 83 with respect to the frequency-band of the RF signal to be sent by the transmitting circuits 25 desirably, so as to reduce loss of RF signal generated during the process of passing the RF signal through the first frequency-band matching adjustment circuit 83.

The capacitance of the second variable capacitor 843 may be adjusted on the basis of the frequency-band of the RF signal to be transmitted desirably, such that high impedance is presented in the second frequency-band matching adjustment circuit 84 with respect to the frequency-band of the RF signal to be sent by the transmitting circuits 25 desirably. When one of the transmitting circuits 25 is allowed for sending the RF signal to the radio-frequency signal transceiving end 21 via the first frequency-band matching adjustment circuit 83 connected thereto, the transmitted RF signal may be not sent to the receiving circuits 27 via the second frequency-band matching adjustment circuit 84. Thus, signal loss generated during the process of transmitting the RF signal may be reduced.

Before the RF signal is received by the wireless transceiver 80, the first switch unit 835 is turned on, such that the radio-frequency signal transceiving end 21 is connected to the ground via the first inductor 831, the first variable capacitor 833, and the first switch unit 835. Furthermore, the second switch unit 845 is turned off, such that the receiving circuits 27 are connected to the radio-frequency signal transceiving end 21 via the second inductor 841 and the second variable capacitor 843.

The capacitance of the first variable capacitor 833 may be adjusted on the basis of the frequency-band of the RF signal to be received by the receiving circuits 27 desirably, such that high impedance is presented in the first frequency-band matching adjustment circuit 83 with respect to the frequency-band of the RF signal to be received by the receiving circuits 27 desirably, so as to reduce loss of received RF signal, resulted from sending the received RF signal into the transmitting circuits 25 via the first frequency-band matching adjustment circuit 83.

The capacitance of the second variable capacitor 843 may be adjusted on the basis of the frequency-band of the RF signal to be received by the receiving circuits 27 desirably, such that low impedance is presented in the second frequency-band matching adjustment circuit 84 with respect to the frequency-band of the RF signal to be received by the receiving circuits 27 desirably, so as to reduce signal loss generated during passing the received RF signal through the second frequency-band matching adjustment circuit 84.

The frequency-band matching adjustment circuit 24/54/74/83/84 described in the present invention may be further operated as a notch filter with function of adjustment, and used for filtering out the specific frequency-band multiplied by one, two, three, or any multiple. Thereby, loss of received or transmitted RF signal may be further reduced.

It is to be understood the invention is not limited to particular systems or methods described which may, of course, vary. It is also to be understood that the terminology used herein is for the purpose of describing particular embodiments only, and is not intended to be limiting. As used in this specification, the singular forms "a", "an" and "the" include plural referents unless the content clearly indicates otherwise. Thus, for example, reference to "a device" includes a combination of two or more devices and reference to "a material" includes mixtures of materials.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

The invention claimed is:

1. A wireless transceiver with function of adjustment for frequency-band matching, used for receiving and transmitting a RF signal, comprising:
   a plurality of transmitting circuits;
   a plurality of receiving circuits;
   a frequency-band matching adjustment circuit, connected to said plurality of receiving circuits or said plurality of transmitting circuits, and adjusting impedance in said frequency-band matching adjustment circuit on the basis of frequency-band of received or transmitted RF signal;

a plurality of frequency-band matching circuits, connected to said plurality of transmitting circuits or said plurality of receiving circuits not connected to said frequency-band matching adjustment circuit, respectively, wherein lower impedance is presented in said plurality of frequency-band matching circuits with respect to the RF signal at individual frequency-bands, respectively; and a radio-frequency signal transceiving end, connected to said frequency-band matching adjustment circuit and said frequency-band matching circuit.

2. The wireless transceiver according to claim 1, wherein said frequency-band matching adjustment circuit comprises a variable capacitor, at least one inductor, and a switch unit, said variable capacitor being connected to said inductor in series, said switch unit being connected at one end thereof to said variable capacitor or said inductor, while said switch unit being connected at the other end thereof to the ground.

3. The wireless transceiver according to claim 2, wherein the impedance in said frequency-band matching adjustment circuit is adjusted via said variable capacitor and said switch unit.

4. The wireless transceiver according to claim 1, wherein said frequency-band matching adjustment circuit comprises at least one capacitor, a variable inductor, and a switch unit, said capacitor being connected to said variable inductor in series, said switch unit being connected at one end thereof to said variable inductor or said capacitor, while said switch unit being connected at the other end thereof to the ground.

5. A wireless transceiver with function of adjustment for frequency-band matching, used for receiving and transmitting a RF signal, comprising:

a plurality of transmitting circuits;

a plurality of receiving circuits;

a first frequency-band matching adjustment circuit, connected to said plurality of transmitting circuits, and adjusting impedance on the basis of frequency-band of said RF signal;

a second frequency-band matching adjustment circuit, connected to said plurality of receiving circuits, and adjusting impedance on the basis of frequency-band of said RF signal; and a radio-frequency signal transceiving end, connected to said first frequency-band matching adjustment circuit and said second frequency-band matching adjustment circuit;

wherein said first frequency-band matching adjustment circuit comprises a first variable capacitor, at least one first inductor, and a first switch unit, said first variable capacitor being connected to said first inductor in series, said first switch unit being connected at one end thereof to said first variable capacitor or said first inductor, said first switch unit being connected at the other end thereof to the ground, while said second frequency-band matching adjustment circuit comprises a second variable capacitor, at least one second inductor, and a second switch unit, said second variable capacitor being connected to said second inductor in series, said second switch unit being connected at one end thereof to said second variable capacitor or said second inductor, said second switch unit being connected at the other end thereof to the ground.

6. An adjusting method for frequency-band matching of a wireless transceiver, wherein said wireless transceiver comprises a plurality of transmitting circuits, a plurality of frequency-band matching circuits, a plurality of receiving circuits, a frequency-band matching adjustment circuit, and a radio-frequency signal transceiving end, said frequency-band matching adjustment circuit being connected to said transmitting circuits or said receiving circuits, while said frequency-band matching circuits being connected to said transmitting circuits or said receiving circuits not connected to said frequency-band matching adjustment circuit, comprising the steps as follows:

adjusting impedance in said frequency-band matching adjustment circuit on the basis of frequency-band of a RF signal to be received or transmitted desirably; and receiving or transmitting said RF signal at the frequency-band.

7. The adjusting method according to claim 6, wherein said frequency-band matching adjustment circuit comprises a variable capacitor, at least one inductor, and a switch unit, said variable capacitor being connected to said inductor, said switch unit being connected at one end thereof to said variable capacitor or said inductor, while said switch unit being connected at the other end thereof to the ground.

8. The adjusting method according to claim 7, wherein said frequency-band matching adjustment circuit is connected to said receiving circuits, while said frequency-band matching circuits are connected to said transmitting circuits, comprising the steps as follows:

turning on said switch unit, such that said variable capacitor and said inductor are connected to the ground via said switch unit;

adjusting capacitance of said variable capacitor on the basis of the frequency-band of said RF signal to be transmitted by said transmitting circuits desirably, such that high impedance is presented in said frequency-band matching adjustment circuit with respect to the frequency-band of said RF signal to be transmitted by said transmitting circuits; and sending said RF signal to said radio-frequency signal transceiving end by one of said transmitting circuits via said frequency-band matching circuit connected thereto.

9. The adjusting method according to claim 8, comprising the steps as follows:

turning off said switch unit, such that said radio-frequency signal transceiving end is connected to said receiving circuits via said variable capacitor and said inductor;

adjusting the capacitance of said variable capacitor on the basis of the frequency-band of said RF signal to be received by said receiving circuits desirably, such that low impedance is presented in said frequency-band matching adjustment circuit with respect to the frequency-band of said RF signal to be received by said receiving circuits desirably; and receiving said RF signal by said receiving circuits from said radio-frequency signal transceiving end via said frequency-band matching adjustment circuit.

10. The adjusting method according to claim 7, wherein said frequency-band matching adjustment circuit is connected to said transmitting circuits, while said frequency-band matching circuits are connected to said receiving circuits, comprising the steps as follows:

turning off said switch unit, such that said radio-frequency signal transceiving end is connected to said transmitting circuits via said variable capacitor and said inductor;

adjusting capacitance of said variable capacitor on the basis of the frequency-band of said RF signal to be transmitted by said transmitting circuits desirably, such that low impedance is presented in said frequency-band matching adjustment circuit with respect to the frequency-band of said RF signal to be transmitted by said transmitting circuits desirably; and sending said RF signal to said radio-frequency signal transceiving end by one of said transmitting circuits via said frequency-band matching adjustment circuit.

11. The adjusting method according to claim 10, comprising the steps as follows:

turning on said switch unit, such that said variable capacitor and said inductor are connected to the ground via said switch unit;

adjusting the capacitance of said variable capacitor on the basis of the frequency-band of said RF signal to be received by said receiving circuits desirably, such that high impedance is presented in said frequency-band matching adjustment circuit with respect to the frequency-band of said RF signal to be received by said receiving circuits desirably; and sending said RF signal to said receiving circuits by said radio-frequency signal transceiving end via one of said frequency-band matching circuits.

12. An adjusting method for frequency-band matching of a wireless transceiver, wherein said wireless transceiver comprises a plurality of transmitting circuits, a plurality of receiving circuits, a first frequency-band matching adjustment circuit, a second frequency-band matching adjustment circuit, and a radio-frequency signal transceiving end, said first frequency-band matching adjustment circuit and said second frequency-band matching adjustment circuit being connected to said transmitting circuits and said receiving circuits, respectively, comprising the steps as follows:

adjusting impedance in said first frequency-band matching adjustment circuit and said second frequency-band matching adjustment circuit on the basis of frequency-band of a RF signal to be received or transmitted desirably; and receiving or transmitting said RF signal at the frequency-band;

wherein said first frequency-band matching adjustment circuit comprises a first variable capacitor, at least one first inductor, and a first switch unit, said first variable capacitor being connected to said first inductor, said first switch unit being connected at one end thereof to said first variable capacitor or said first inductor, said first switch unit being connected at the other end thereof to the ground, while said second frequency-band matching adjustment circuit comprises a second variable capacitor, at least one second inductor, and a second switch unit, said second variable capacitor being connected to said second inductor, said second switch unit being connected at one end thereof to said second variable capacitor or said second inductor, said second switch unit being connected at the other end thereof to the ground.

13. The adjusting method according to claim 12, comprising the steps as follows:

turning off said first switch unit;

turning on said second switch unit, such that said radio-frequency signal transceiving end is connected to the ground via said second variable capacitor, said second inductor, and said second switch unit;

adjusting capacitance of said first variable capacitor and said second variable capacitor on the basis of the frequency-band of said RF signal to be transmitted by said transmitting circuits desirably, such that low impedance is presented in said first frequency-band matching adjustment circuit with respect to the frequency-band of said RF signal to be transmitted by said transmitting circuits desirably, and that high impedance is presented in said second frequency-band matching adjustment circuit with respect to the frequency-band of said RF signal to be transmitted by said transmitting circuits desirably; and sending said RF signal to said radio-frequency signal transceiving end by one of said transmitting circuits via said first frequency-band matching adjustment circuit connected thereto.

14. The adjusting method according to claim 12, comprising the steps as follows:

turning on said first switch unit, such that said radio-frequency signal transceiving end is connected to the ground via said first variable capacitor, said first inductor, and said first switch unit;

turning off said second switch unit;

adjusting capacitance of said first variable capacitor and said second variable capacitor on the basis of the frequency-band of said RF signal to be received by said receiving circuits desirably, such that high impedance is presented in said first frequency-band matching adjustment circuit with respect to the frequency-band of said RF signal to be received by said receiving circuits desirably, and that low impedance is presented in said second frequency-band matching adjustment circuit with respect to the frequency-band of said RF signal to be received by said receiving circuits desirably; and receiving said RF signal by one of said receiving circuits from said radio-frequency signal transceiving end via said second frequency-band matching adjustment circuit.

* * * * *